United States Patent
Son et al.

(10) Patent No.: US 8,578,227 B2
(45) Date of Patent: Nov. 5, 2013

(54) DELAY TEST DEVICE AND SYSTEM-ON-CHIP HAVING THE SAME

(75) Inventors: Young-Jae Son, Hwaseong-si (KR); Yong-Jin Yoon, Seoul (KR); Uk-Rae Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 530 days.

(21) Appl. No.: 12/944,787

(22) Filed: Nov. 12, 2010

(65) Prior Publication Data
US 2011/0154142 A1 Jun. 23, 2011

(30) Foreign Application Priority Data
Dec. 21, 2009 (KR) .................. 10-2009-0127766

(51) Int. Cl.
*G01R 31/28* (2006.01)

(52) U.S. Cl.
USPC ........................................ 714/744

(58) Field of Classification Search
None
See application file for complete search history.

(56) References Cited

U.S. PATENT DOCUMENTS

| | | | | |
|---|---|---|---|---|
| 5,256,964 A | * | 10/1993 | Ahmed et al. | 324/750.02 |
| 5,794,175 A | * | 8/1998 | Conner | 702/119 |
| 6,880,137 B1 | * | 4/2005 | Burlison et al. | 714/724 |
| 6,934,900 B1 | * | 8/2005 | Cheng et al. | 714/738 |
| 7,020,817 B2 | * | 3/2006 | Komatsu | 714/724 |
| 7,613,971 B2 | * | 11/2009 | Asaka | 714/731 |
| 7,644,331 B2 | * | 1/2010 | Haugestuen | 714/731 |
| 2007/0143652 A1 | * | 6/2007 | Baba | 714/724 |
| 2009/0240969 A1 | * | 9/2009 | Chiu et al. | 713/401 |
| 2011/0271156 A1 | * | 11/2011 | Chhabra | 714/718 |

FOREIGN PATENT DOCUMENTS

| | | |
|---|---|---|
| KR | 10-0318445 | 9/2002 |
| KR | 10-2007-0029528 | 3/2007 |

* cited by examiner

*Primary Examiner* — Gabriel Chu
(74) *Attorney, Agent, or Firm* — Harness, Dickey & Pierce

(57) ABSTRACT

A test device for a system-on-chip includes a sequential logic circuit and a test circuit. The sequential logic circuit generates a test input signal by converting a serial input signal into a parallel format in response to a serial clock signal and a serial enable signal and generates a serial output signal by converting a test output signal into a serial format in response to the serial clock signal and the serial enable signal. The test circuit includes at least one delay unit that is separated from a logic circuit performing original functions of the system-on-chip, performs a delay test on the at least one delay unit using the test input signal in response to a system clock signal and a test enable signal, and provides the test output signal to the sequential logic circuit, where the test output signal representing a result of the delay test.

20 Claims, 10 Drawing Sheets

110a

210a

215a

215b

DELAY TEST DEVICE AND SYSTEM-ON-CHIP HAVING THE SAME

CROSS-REFERENCE TO RELATED APPLICATION(S)

This application claims priority under 35 USC §119 to Korean Patent Application No. 2009-0127766, filed on Dec. 21, 2009, in the Korean Intellectual Property Office (KIPO), the contents of which are incorporated herein in its entirety by reference.

BACKGROUND

1. Technical Field

Example embodiments relate to integrated circuits, and more particularly to a test device and a system-on-chip having the test device.

2. Description of the Related Art

Recently, a system-on-chip is widely used, which is a single chip where various elements, such as a processor and a memory, are integrated. As the number of elements integrated in the system-on-chip increases, testability of the system-on-chip for detecting defects in the system-on-chip becomes more important.

Particularly, problems caused by a delay of a signal become serious when operating frequency of the system-on-chip increases. Such delay of the signal occurs when the signal propagates slowly in comparison with a modeled propagation time due to variations of manufacturing process.

It is difficult to detect a critical path that causes a severe delay, since the conventional test apparatus performs a delay test on paths that are used for performing original functions of the system-on-chip.

SUMMARY

Some example embodiments provide a test device for a system-on-chip that detects a path causing a delay and measures a propagation time of a path.

Some example embodiments provide a system-on-chip including a test device for detecting a path causing a delay and measuring a propagation time of a path.

In example embodiments, a test device for a system-on-chip may include a sequential logic circuit and a test circuit. The sequential logic circuit may be configured to generate a test input signal by converting a serial input signal into a parallel format in response to a serial clock signal and a serial enable signal. The test device may also be configured to generate a serial output signal by converting a test output signal into a serial format in response to the serial clock signal and the serial enable signal. The test circuit may include at least one delay unit and the at least one delay unit may be separated from a logic circuit configured to perform original functions of the system-on-chip. The test circuit may be further configured to perform a delay test on the at least one delay unit using the test input signal in response to a system clock signal and a test enable signal and provide the test output signal to the sequential logic circuit, the test output signal representing a result of the delay test.

According to example embodiments, a test device for a system-on-chip may include a sequential logic circuit and a test circuit. The sequential logic circuit may generate a test input signal by converting a serial input signal into a parallel format in response to a serial clock signal and a serial enable signal and generate a serial output signal by converting a test output signal into a serial format in response to the serial clock signal and the serial enable signal. The test circuit may include at least one delay unit that may be separated from a logic circuit performing original functions of the system-on-chip, perform a delay test on the at least one delay unit using the test input signal in response to a system clock signal and a test enable signal, and provide the test output signal to the sequential logic circuit, where the test output signal representing a result of the delay test.

The sequential logic circuit may latch each bit of the serial input signal to generate the test input signal and provide the test input signal to the test circuit in a first operation stage. The test circuit may perform the delay test on each of the at least one delay unit using each bit of the test input signal, respectively, and provide the test output signal to the sequential logic circuit in a second operation stage, where each bit of the test output signal representing the result of the delay test on each of the at least one delay unit. The sequential logic circuit may latch each bit of the test output signal to generate the serial output signal in a third operation stage.

The sequential logic circuit may be at a standby mode in the second operation stage, and the test circuit may be at a standby mode in the first operation stage and the third operation stage.

The at least one delay unit may include a replica of a path included in a logic circuit performing original functions of the system-on-chip.

The at least one delay unit may include a plurality of inverters, each of the plurality of inverters including one of complementary metal oxide semiconductor (CMOS) transistors, p-channel metal oxide semiconductor (PMOS) transistors and n-channel metal oxide semiconductor (NMOS) transistors.

The test circuit may include a same number of delay units as a number of bits included in the serial input signal.

The test circuit may perform the delay test on each of the at least one delay unit using each bit of the test input signal, respectively, and each bit of the test output signal may represent the result of the delay test on each of the at least one delay unit.

The serial input signal may include one bit, and the sequential logic circuit may latch the serial input signal in synchronization with the serial clock signal to generate the test input signal when the serial enable signal is activated, and latch the test output signal in synchronization with the serial clock signal to generate the serial output signal when the serial enable signal is deactivated.

The sequential logic circuit may include a first flip-flop circuit and a second flip-flop circuit, where each of the first flip-flop circuit and the second flip-flop circuit include a first input terminal, a second input terminal and an output terminal. The first input terminal of the first flip-flop circuit may be open, the second input terminal of the first flip-flop circuit may receive the serial input signal and the output terminal of the first flip-flop circuit may output the test input signal. The first input terminal of the second flip-flop circuit may receive the test output signal, the second input terminal of the second flip-flop circuit may be connected to the output terminal of the first flip-flop circuit and the output terminal of the second flip-flop circuit may output the serial output signal.

Each of the first flip-flop circuit and the second flip-flop circuit may output a signal received from the second input terminal in synchronization with the serial clock signal when the serial enable signal is activated, and output a signal received from the first input terminal in synchronization with the serial clock signal when the serial enable signal is deactivated.

Each of the first flip-flop circuit and the second flip-flop circuit may include a multiplexer configured to output the signal received from the second input terminal when the serial enable signal is activated and to output the signal received from the first input terminal when the serial enable signal is deactivated, and a flip-flop configured to latch the output signal of the multiplexer in synchronization with the serial clock signal to output a latched signal.

The test circuit may include one delay unit, and the test circuit may provide the test input signal to the one delay unit in synchronization with a rising edge or a falling edge of the system clock signal when the test enable signal is activated, and provide an output signal of the one delay unit to the sequential logic circuit as the test output signal in synchronization with a next rising edge or a next falling edge of the system clock signal.

The test circuit further may include an AND gate configured to perform an AND operation on the test enable signal and the system clock signal to output a test clock signal having a first pulse and a second pulse, a first flip-flop configured to provide the test input signal to the one delay unit as a delay input signal in synchronization with the first pulse of the test clock signal, and a second flip-clop configured to provide an output signal of the one delay unit to the sequential logic circuit as the test output signal in synchronization with the second pulse of the test clock signal, where the one delay unit may receive the delay input signal and delays the delay input signal.

The test circuit may further include a clock delay unit connected between the AND gate and the second flip-flop and delaying the test clock signal by a clock-to-Q delay of the second flip-flop.

The serial input signal includes N bits, and the sequential logic circuit may latch the N bits of the serial input signal sequentially in synchronization with the serial clock signal to generate the test input signal having N bits when the serial enable signal is activated, latch N bits of the test output signal simultaneously in synchronization with the serial clock signal when the serial enable signal is deactivated, and output the latched N bits of the test output signal sequentially as the serial output signal, where N is a positive integer.

The test circuit may include N delay units, and the test circuit may provide the N bits of the test input signal to the N delay units, respectively, in synchronization with a rising edge or a falling edge of the system clock signal when the test enable signal is activated, and provide output signals of the N delay units to the sequential logic circuit as the test output signal having N bits in synchronization with a next rising edge or a next falling edge of the system clock signal.

The test device may further include a serial clock generating unit configured to generate the serial clock signal by masking the system clock signal.

According to example embodiments, a system-on-chip includes a clock generator, a logic circuit and a test device. The clock generator may generate a system clock signal. The logic circuit may perform original functions of the system-on-chip. The test device may include at least one delay unit that is separated from the logic circuit, perform a delay test on the at least one delay unit using a serial input signal in response to the system clock signal, a serial enable signal and a test enable signal and provide a serial output signal representing a result of the delay test.

The test device may include a serial clock generating unit configured to generate a serial clock signal by masking the system clock signal, a sequential logic circuit configured to generate a test input signal by converting the serial input signal into a parallel format in response to the serial clock signal and the serial enable signal and to generate the serial output signal by converting a test output signal into a serial format in response to the serial clock signal and the serial enable signal, and a test circuit including the at least one delay unit, the test circuit performing the delay test on the at least one delay unit using the test input signal in response to the system clock signal and the test enable signal and providing the test output signal that represents the result of the delay test to the sequential logic circuit.

The test circuit may include a same number of delay units as a number of bits included in the serial input signal, and perform the delay test on each of the at least one delay unit using each bit of the test input signal, respectively, and each bit of the test output signal may represent the result of the delay test on each of the at least one delay unit.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
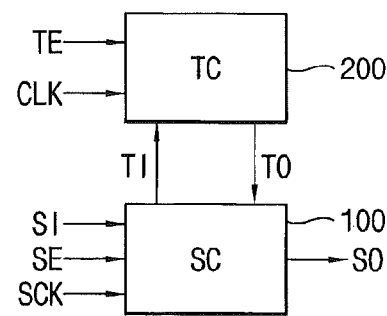
FIG. 1 is a diagram illustrating a test device for a system-on-chip according to example embodiments.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this disclosure will be thorough and complete, and will fully convey the scope of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements that may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a test device for a system-on-chip according to example embodiments.

Referring to FIG. 1, a test device 1000 for a system-on-chip includes a sequential logic circuit (SC) 100 and a test circuit (TC) 200.

The sequential logic circuit 100 receives a serial input signal SI, a serial enable signal SE and a serial clock signal SCK from outside, and generates a test input signal TI by converting the serial input signal SI into a parallel format in response to the serial clock signal SCK and the serial enable signal SE. The sequential logic circuit 100 receives a test output signal TO from the test circuit 200, and generates a serial output signal SO by converting the test output signal TO into a serial format in response to the serial clock signal SCK and the serial enable signal SE.

The test circuit 200 includes at least one delay unit that is separated from a logic circuit performing original functions of the system-on-chip. The test circuit 200 receives a test enable signal TE and a system clock signal CLK from outside and the test input signal TI from the sequential logic circuit 100, and performs a delay test on the at least one delay unit using the test input signal TI in response to the system clock signal CLK and the test enable signal TE. The test circuit 200 provides the test output signal TO that represents a result of the delay test to the sequential logic circuit 100.

An operation of the test device 1000 may be divided into three stages. In a first operation stage, the sequential logic circuit 100 may latch each bit of the serial input signal SI to generate the test input signal TI and provide the test input signal TI to the test circuit 200. In a second operation stage, the test circuit 200 may perform the delay test on each of the at least one delay unit using each bit of the test input signal TI, respectively, and provide the test output signal TO to the sequential logic circuit 100. Each bit of the test output signal TO may represent the result of the delay test on each of the at least one delay unit. In a third operation stage, the sequential logic circuit 100 may latch each bit of the test output signal TO to generate the serial output signal SO. The sequential logic circuit 100 may be at a standby mode in the second operation stage, and the test circuit 200 may be at a standby mode in the first operation stage and the third operation stage.

As described above, the at least one delay unit is separated from a logic circuit performing original functions of the system-on-chip. That is, the test device 1000 does not use the logic circuit performing original functions of the system-on-chip as the at least one delay unit. In some example embodiments, the at least one delay unit may include a replica of a path included in the logic circuit performing original functions of the system-on-chip. In other example embodiments, the at least one delay unit may include a plurality of inverters serially connected to each other. Each of the plurality of inverters may include one of complementary metal oxide semiconductor (CMOS) transistors, p-channel metal oxide semiconductor (PMOS) transistors and n-channel metal oxide semiconductor (NMOS) transistors.

The test circuit 200 may include a same number of delay units as a number of bits included in the serial input signal. The test circuit 200 may perform the delay test on each of the at least one delay unit using each bit of the test input signal TI, respectively, and each bit of the test output signal TO may represent the result of the delay test on each of the at least one delay unit.

In some example embodiments, the serial input signal SI may include N bits and the test circuit 200 may include N delay units, where N is a positive integer. In this case, the test device 1000 may receive the serial input signal SI including N bits, perform the delay test on the N delay units simultaneously using N bits of the serial input signal SI, and provide the serial output signal SO that represents the result of the delay test on the N delay units.

In the first operation stage, the sequential logic circuit 100 may latch the N bits of the serial input signal SI sequentially in synchronization with the serial clock signal SCK to generate the test input signal TI having N bits when the serial enable signal SE is activated.

In the second operation stage, the test circuit 200 may provide the N bits of the test input signal TI to the N delay units, respectively, in synchronization with a rising edge or a falling edge of the system clock signal CLK when the test enable signal TE is activated, and provide output signals of the N delay units to the sequential logic circuit 100 simultaneously as the test output signal TO having N bits in synchronization with a next rising edge or a next falling edge of the system clock signal CLK.

In the third operation stage, the sequential logic circuit 100 may latch N bits of the test output signal TO simultaneously in synchronization with the serial clock signal SCK when the serial enable signal SE is deactivated, and output the latched N bits of the test output signal TO sequentially as the serial output signal SO.

Figure 2:
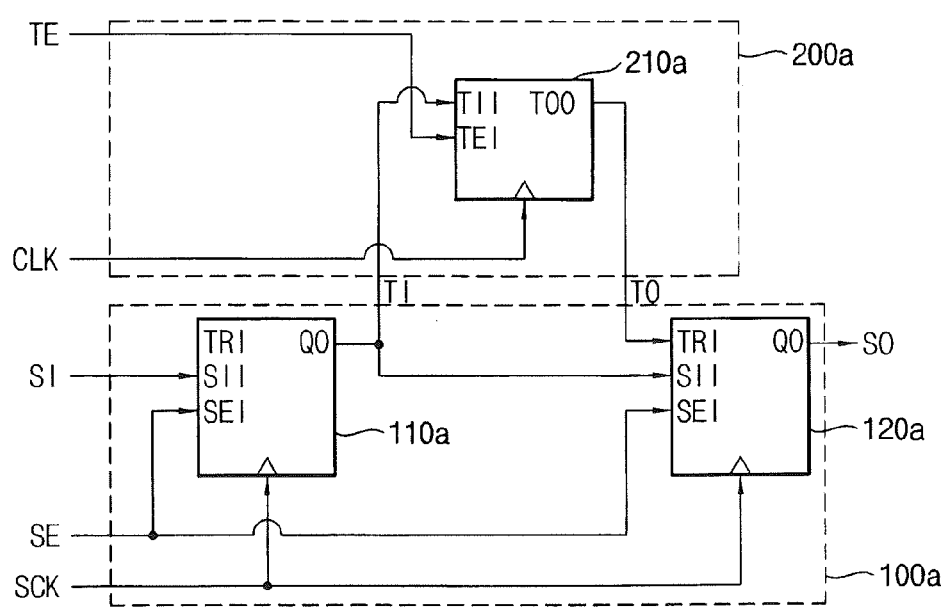
FIG. 2 is a block diagram illustrating a non-limiting example of a test device of FIG. 1.

FIG. 2 is a block diagram illustrating an example of a test device of FIG. 1.

Referring to FIG. 2, a test device 1000a includes a sequential logic circuit 100a and a test circuit 200a.

In the test device 1000a of FIG. 2, the serial input signal SI includes one bit and the test circuit 200a includes one delay unit. The test device 1000a may receive the serial input signal SI including one bit, perform the delay test on the one delay unit using one bit of the serial input signal SI, and provide the serial output signal SO that represents the result of the delay test on the one delay unit.

In the first operation stage, the sequential logic circuit 100a may latch the one bit of the serial input signal SI in synchronization with the serial clock signal SCK to generate the test input signal TI having one bit when the serial enable signal SE is activated.

In the second operation stage, the test circuit 200a may provide the one bit of the test input signal TI to the one delay unit in synchronization with a rising edge or a falling edge of the system clock signal CLK when the test enable signal TE is activated, and provide an output signal of the one delay unit to the sequential logic circuit 100a as the test output signal TO having one bit in synchronization with a next rising edge or a next falling edge of the system clock signal CLK when the test enable signal TE is activated.

In the third operation stage, the sequential logic circuit 100a may latch the one bit of the test output signal TO in synchronization with the serial clock signal SCK to generate the serial output signal SO having one bit when the serial enable signal SE is deactivated.

Referring to FIG. 2, the sequential logic circuit 100a includes a first flip-flop circuit 110a and a second flip-flop circuit 120a.

Each of the first flip-flop circuit 110a and the second flip-flop circuit 120a may include a first input terminal TRI, a second input terminal SII, a third input terminal SEI and an output terminal QO. Each of the first flip-flop circuit 110a and the second flip-flop circuit 120a may operate in synchronization with the serial clock signal SCK.

The first input terminal TRI of the first flip-flop circuit 110a may be open. That is, a signal received from the first input terminal TRI of the first flip-flop circuit 110a may be ignored. The second input terminal SII of the first flip-flop circuit 110a may receive the serial input signal SI, the third input terminal SEI of the first flip-flop circuit 110a may receive the serial enable signal SE and the output terminal QO of the first flip-flop circuit 110a may output the test input signal TI.

The first input terminal TRI of the second flip-flop circuit 120a may receive the test output signal TO from the test circuit 200a, the second input terminal SII of the second flip-flop circuit 120a may be connected to the output terminal QO of the first flip-flop circuit 110a, the third input terminal SEI of the second flip-flop circuit 120a may receive the serial enable signal SE and the output terminal QO of the second flip-flop circuit 120a may output the serial output signal SO.

Each of the first flip-flop circuit 110a and the second flip-flop circuit 120a may output a signal received at the second input terminal SII in synchronization with the serial clock signal SCK when the serial enable signal SE is activated, and output a signal received at the first input terminal TRI in synchronization with the serial clock signal SCK when the serial enable signal SE is deactivated.

Figure 3:
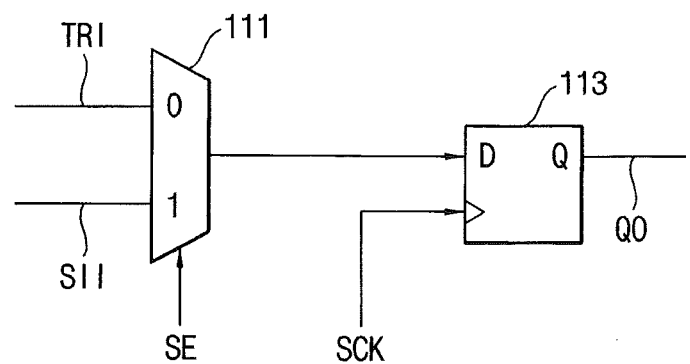
FIG. 3 is a circuit diagram illustrating a non-limiting example of a first flip-flop circuit included in a sequential logic circuit of FIG. 2.

FIG. 3 is a circuit diagram illustrating an example of a first flip-flop circuit included in a sequential logic circuit of FIG. 2.

Referring to FIG. 3, the first flip-flop circuit 110a includes a multiplexer 111 and a flip-flop 113.

The multiplexer 111 may receive the signal received from the first input terminal TRI and the signal received from the second input terminal SII. The multiplexer 111 may output one of the signal received from the second input terminal SII and the signal received from the first input terminal TRI based on the serial enable signal SE. For example, the multiplexer 111 may output the signal received from the second input terminal SII when the serial enable signal SE is activated and output the signal received from the first input terminal TRI when the serial enable signal SE is deactivated.

The flip-flop 113 may receive an output signal of the multiplexer 111 and the serial clock signal SCK. The flip-flop 113 may output the output signal of the multiplexer 111 by latching the output signal of the multiplexer 111 in synchronization with the serial clock signal SCK.

The second flip-flop circuit 120a included in the sequential logic circuit 100a may have the same structure as the first flip-flop circuit 110a, and thus, a detailed description of the structure of the second flip-flop circuit 120a will be omitted.

Referring again to FIG. 2, the test circuit 200a includes a test module 210a.

The test module 210a may include a first input terminal TII, a second input terminal TEI and an output terminal TOO. The test module 210a may operate in synchronization with the system clock signal CLK.

The first input terminal TII of the test module 210a may receive the test input signal TI from the first flip-flop circuit 110a, the second input terminal TEI of the test module 210a may receive the test enable signal TE and the output terminal TOO of the test module 210a may output the test output signal TO to the second flip-flop circuit 120a.

The test module 210a may output the test input signal TI received from the first flip-flop circuit 110a to the one delay unit in synchronization with a rising edge or a falling edge of the system clock signal CLK when the test enable signal TE is activated, and output an output signal of the one delay unit to the second flip-flop circuit 120a as the test output signal TO in synchronization with a next rising edge or a next falling edge of the system clock signal CLK.

Figure 4:
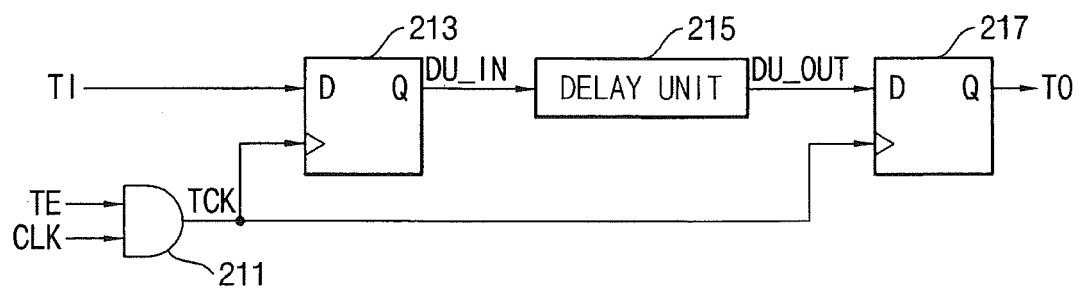
FIG. 4 is a circuit diagram illustrating a non-limiting example of a test module included in a test circuit of FIG. 2.

FIG. 4 is a circuit diagram illustrating an example of a test module included in a test circuit of FIG. 2.

Referring to FIG. 4, the test module 210a includes an AND gate 211, a first flip-flop 213, a delay unit 215 and a second flip-flop 217.

The AND gate 211 may receive the test enable signal TE and the system clock signal CLK and generate a test clock signal TCK. The AND gate 211 may perform an AND operation on the test enable signal TE and the system clock signal CLK to generate the test clock signal TCK. A duration during which the test enable signal TE is activated may be about two times of the period of the system clock signal CLK, so that the AND gate 211 may mask the system clock signal CLK with the test enable signal TE to generate the test clock signal TCK having two consecutive pulses. The two consecutive pulses may include a first pulse and a second pulse.

The first flip-flop 213 may provide the test input signal TI received from the first flip-flop circuit 110a of the sequential logic circuit 100a to the delay unit 215 as a delay input signal DU_IN in synchronization with the first pulse of the test clock signal TCK.

The delay unit 215 may receive the delay input signal DU_IN and delay the delay input signal DU_IN to generate a delay output signal DU_OUT.

The second flip-flop 217 may provide the delay output signal DU_OUT received from the delay unit 215 to the second flip-flop circuit 120a of the sequential logic circuit 100a as the test output signal TO in synchronization with the second pulse of the test clock signal TCK.

When the delay input signal DU_IN completely propagates through the delay unit 215 before the second pulse of the test clock signal TCK, the delay output signal DU_OUT may have the same value as the test input signal TI, such that the test output signal TO has the same value as the test input signal TI.

On the contrary, when the delay input signal DU_IN does not completely propagate through the delay unit 215 before the second pulse of the test clock signal TCK, the delay output signal DU_OUT may not have the same value as the test input signal TI, such that the test output signal TO does not have the same value as the test input signal TI.

That is, the test output signal TO may have the same value as the test input signal TI when the delay input signal DU_IN, which is inputted to the delay unit 215 in synchronization with the first pulse of the test clock signal TCK, completely propagates through the delay unit 215 before the second pulse of the test clock signal TCK.

Therefore, the test output signal TO may represent the result of the delay test on the delay unit 215. Since the test input signal TI has the same value as the serial input signal SI and the serial output signal SO has the same value as the test output signal TO, the result of the delay test on the delay unit 215 may be determined by comparing the serial output signal SO with the serial input signal SI.

As described above, a time between the first pulse of the test clock signal TCK and the second pulse of the test clock signal TCK is one period of the system clock signal CLK. Therefore, the delay unit 215 may be able to operate normally at the frequency of the system clock signal CLK if the serial output signal SO has the same value as the serial input signal SI, and the delay unit 215 may not be able to operate normally at the frequency of the system clock signal CLK if the serial output signal SO does not have the same value as the serial input signal SI. Furthermore, a propagation delay of the delay unit 215 may be determined exactly by detecting a maximum frequency of the system clock signal CLK in a condition that the serial output signal SO has the same value as the serial input signal SI.

Figure 5A:
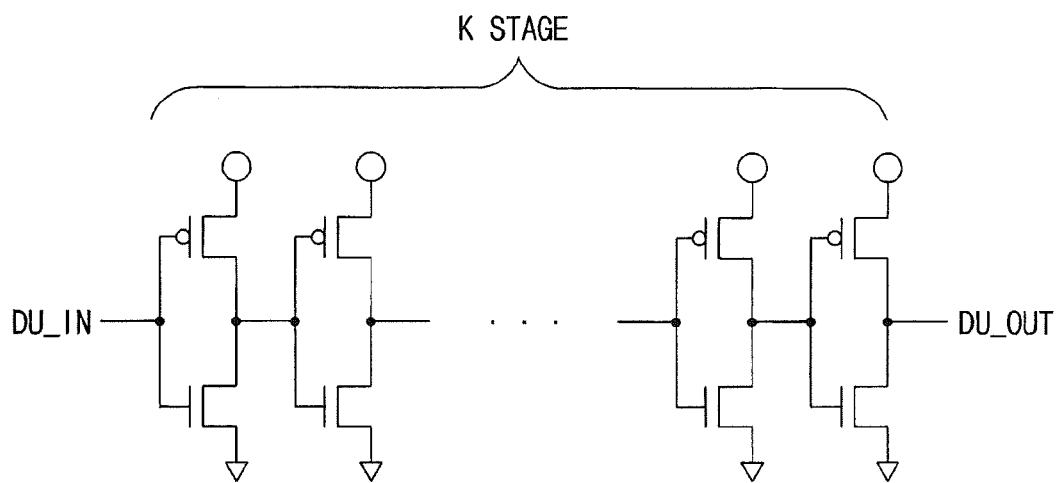
FIGS. 5A, 5B and 5C are a circuit diagrams illustrating non-limiting examples of a delay unit included in a test module of FIG. 4.
Figure 5B:
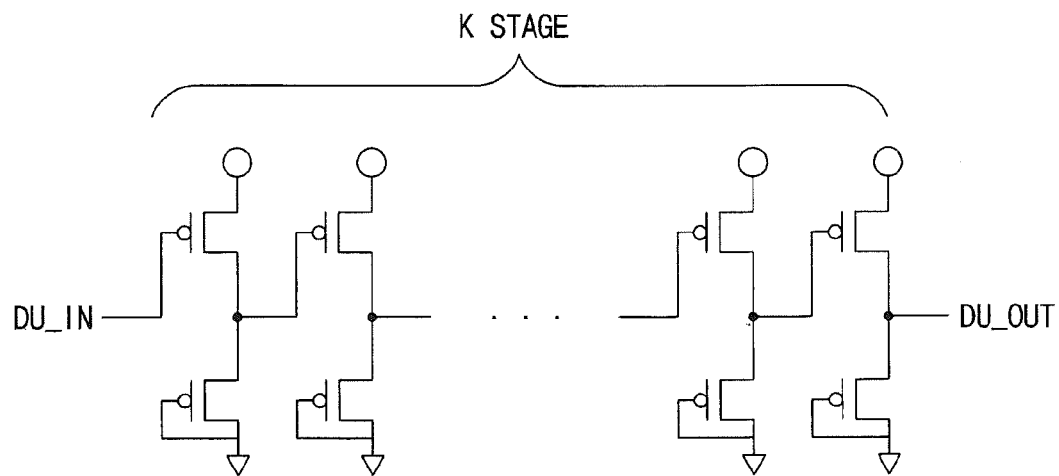
Figure 5C:
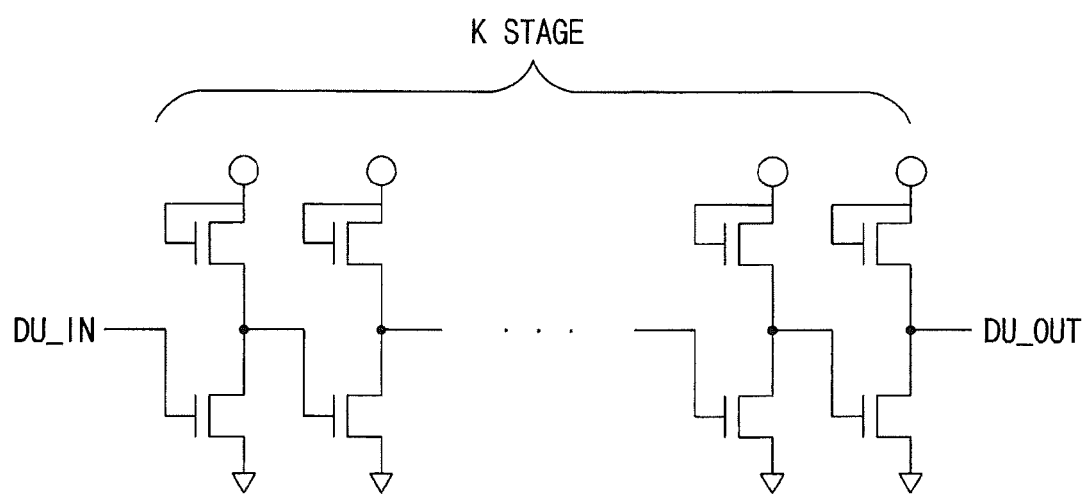

FIGS. 5A, 5B and 5C are a circuit diagrams illustrating examples of a delay unit included in a test module of FIG. 4.

Referring to FIGS. 5A, 5B and 5C, the delay unit 215 may include K inverters serially connected to each other, where K is a positive integer. K may be an even number so that the delay output signal DU_OUT may have the same value as the delay input signal DU_IN. The delay unit 215a of FIG. 5A may include K inverters having CMOS transistors. When the delay unit 215 includes inverters having CMOS transistors, the test device 1000 may determine an exact propagation delay of a CMOS transistor included in the logic circuit performing original functions of the system-on-chip. The delay unit 215b of FIG. 5B includes K inverters which include PMOS transistors. When the delay unit 215 includes inverters having PMOS transistors, the test device 1000 may determine an exact propagation delay of a PMOS transistor included in the logic circuit performing original functions of the system-on-chip. The delay unit 215c of FIG. 5C includes K inverters which include NMOS transistors. When the delay unit 215 includes inverters having NMOS transistors, the test device 1000 may determine an exact propagation delay of a NMOS transistor included in the logic circuit performing original functions of the system-on-chip.

In some example embodiments, the delay unit 215 may include a replica of a path between flip-flops included in the logic circuit performing original functions of the system-on-chip. When the delay unit 215 includes a replica of a path between flip-flops included in the logic circuit performing original functions of the system-on-chip, the test device 1000 may determine an exact propagation delay of the path between flip-flops included in the logic circuit performing original functions of the system-on-chip. In addition, a correlation between a silicon wafer and a static timing analysis (STA) conventionally used in a logic design, and an operation speed of the system-on-chip on an individual wafer on which the system-on-chip is formed may be determined using the test device 1000.

Figure 6:
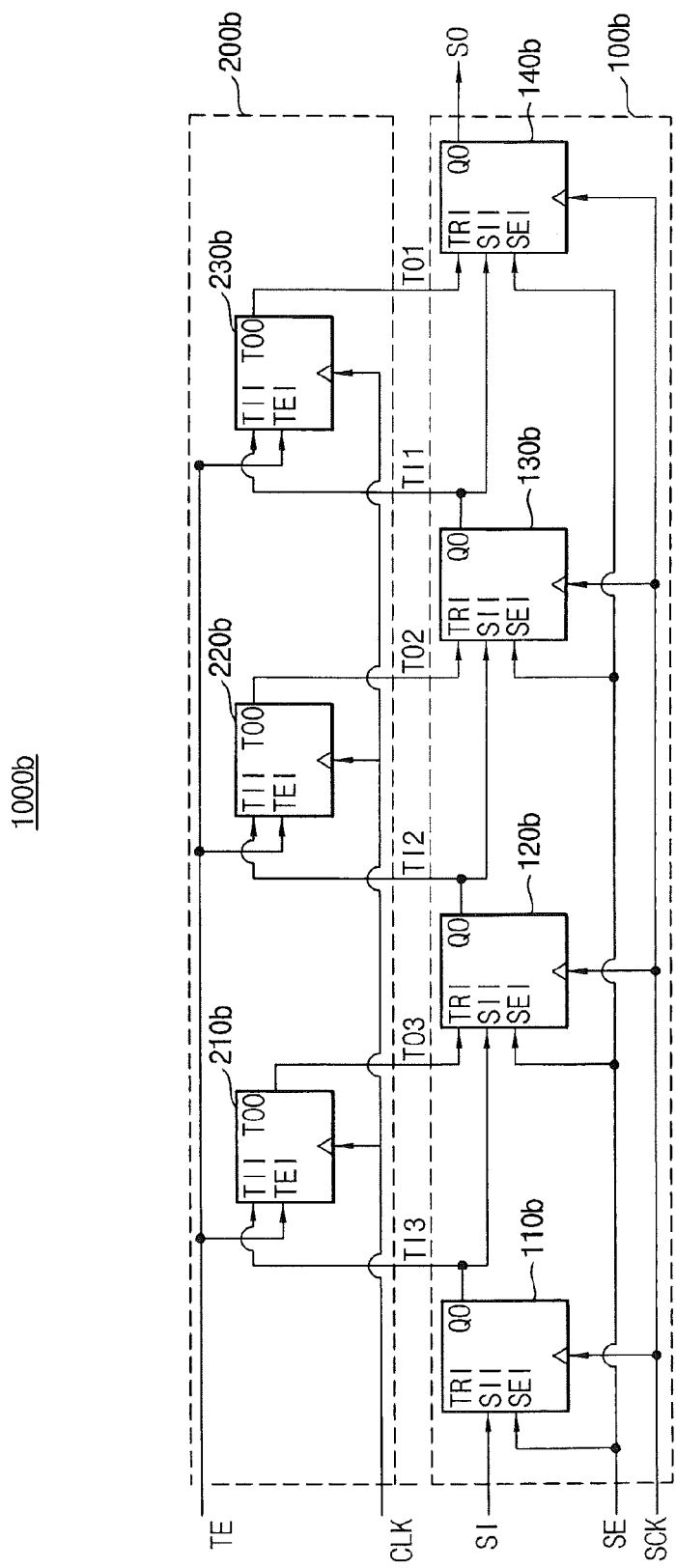
FIG. 6 is a block diagram illustrating another non-limiting example of a test device of FIG. 1.

FIG. 6 is a block diagram illustrating another example of a test device of FIG. 1.

Referring to FIG. 6, a test device 1000b includes a sequential logic circuit 100b and a test circuit 200b.

In the test device 1000b of FIG. 6, the serial input signal SI includes three bits and the test circuit 200b includes three delay units. The test device 1000b may receive the serial input signal SI including three bits, perform the delay test on the three delay units using three bits of the serial input signal SI, and provide the serial output signal SO that represents the result of the delay test on the three delay units.

In the first operation stage, the sequential logic circuit 100b may latch the three bits of the serial input signal SI sequentially in synchronization with the serial clock signal SCK to generate the test input signal TI having three bits when the serial enable signal SE is activated.

In the second operation stage, the test circuit 200b may provide the three bits of the test input signal TI to the three delay units, respectively, in synchronization with a rising edge or a falling edge of the system clock signal CLK when the test enable signal TE is activated, and provide output signals of the three delay units to the sequential logic circuit 100b as the test output signal TO having three bits in synchronization with a next rising edge or a next falling edge of the system clock signal CLK.

In the third operation stage, the sequential logic circuit 100b may latch three bits of the test output signal TO simultaneously in synchronization with the serial clock signal SCK when the serial enable signal SE is deactivated, and output the latched three bits of the test output signal TO sequentially as the serial output signal SO.

Referring to FIG. 6, the sequential logic circuit 100b includes a first flip-flop circuit 110b, a second flip-flop circuit 120b, a third flip-flop circuit 130b and a fourth flip-flop circuit 140b.

Each of the first flip-flop circuit 110b, the second flip-flop circuit 120b, the third flip-flop circuit 130b and the fourth flip-flop circuit 140b may include a first input terminal TRI, a second input terminal SII, a third input terminal SEI and an output terminal QO. Each of the first flip-flop circuit 110b, the second flip-flop circuit 120b, the third flip-flop circuit 130b and the fourth flip-flop circuit 140b may operate in synchronization with the serial clock signal SCK.

The first input terminal TRI of the first flip-flop circuit 110b may be open. That is, a signal received from the first input terminal TRI of the first flip-flop circuit 110b may be ignored. The second input terminal SII of the first flip-flop circuit 110b may receive the three bits of the serial input signal SI consecutively, the third input terminal SEI of the first flip-flop circuit 110b may receive the serial enable signal SE and the output terminal QO of the first flip-flop circuit 110b may output three bits of the test input signal TI consecutively.

The first input terminals TRI of the second to the fourth flip-flop circuits 120b, 130b and 140b may receive each bit of the test output signal TO from the test circuit 200b. The second input terminals SII of the second to the fourth flip-flop circuits 120b, 130b and 140b may be connected to the output terminals QO of the first to the third flip-flop circuits 110b, 120b and 130b, respectively. The third input terminals SEI of the second to the fourth flip-flop circuits 120b, 130b and 140b may receive the serial enable signal SE. The output terminals QO of the second to the fourth flip-flop circuits 120b, 130b and 140b may output one of a signal received from the first input terminals TRI and a signal received from the second input terminals SII based on the serial enable signal SE.

Each of the first to the fourth flip-flop circuits 110b, 120b, 130b and 140b may output a signal received from the second input terminal SII in synchronization with the serial clock signal SCK when the serial enable signal SE is activated, and output a signal received from the first input terminal TRI in synchronization with the serial clock signal SCK when the serial enable signal SE is deactivated.

The first to the fourth flip-flop circuits 110b, 120b, 130b and 140b may have the same structure as the first flip-flop circuit 110a of FIG. 3, and thus, a detailed description of the structure of the first to the fourth flip-flop circuits 110b, 120b, 130b and 140b will be omitted.

Referring again to FIG. 6, the test circuit 200b includes a first test module 210b, a second test module 220b and a third test module 230b.

The first test module 210b may include a first delay unit, the second test module 220b may include a second delay unit and the third test module 230b may include a third delay unit.

The first to the third test modules 210b, 220b and 230b may include a first input terminal TII, a second input terminal TEI and an output terminal TOO. The first to the third test modules 210b, 220b and 230b may operate in synchronization with the system clock signal CLK.

The first input terminal TII of the first test module 210b may receive a third bit TI3 of the test input signal TI from the first flip-flop circuit 110b, the first input terminal TII of the second test module 220b may receive a second bit TI2 of the test input signal TI from the second flip-flop circuit 120b and the first input terminal TII of the third test module 230b may receive a first bit TI1 of the test input signal TI from the third flip-flop circuit 130b. The second input terminals TEI of the first to the third test modules 210b, 220b and 230b may receive the test enable signal TE. The output terminal TOO of the first test module 210b may output a third bit TO3 of the test output signal TO to the second flip-flop circuit 120b, the output terminal TOO of the second test module 220b may output a second bit TO2 of the test output signal TO to the third flip-flop circuit 130b and the output terminal TOO of the third test module 230b may output a first bit TO1 of the test output signal TO to the fourth flip-flop circuit 140b.

The first test module 210b may output the third bit TI3 of the test input signal TI received from the first flip-flop circuit 110b to the first delay unit in synchronization with a rising edge or a falling edge of the system clock signal CLK when the test enable signal TE is activated, and output an output signal of the first delay unit to the second flip-flop circuit 120b as the third bit TO3 of the test output signal TO in synchronization with a next rising edge or a next falling edge of the system clock signal CLK.

The second test module 220b may output the second bit TI2 of the test input signal TI received from the second flip-flop circuit 120b to the second delay unit in synchronization with a rising edge or a falling edge of the system clock signal CLK when the test enable signal TE is activated, and output an output signal of the second delay unit to the third flip-flop circuit 130b as the second bit TO2 of the test output signal TO in synchronization with a next rising edge or a next falling edge of the system clock signal CLK.

The third test module 230b may output the first bit TI1 of the test input signal TI received from the third flip-flop circuit 130b to the third delay unit in synchronization with a rising edge or a falling edge of the system clock signal CLK when the test enable signal TE is activated, and output an output signal of the third delay unit to the fourth flip-flop circuit 140b as the first bit TO1 of the test output signal TO in synchronization with a next rising edge or a next falling edge of the system clock signal CLK.

The first to the third test modules 210b, 220b and 230b may have the same structure as the test module 210a of FIG. 4, and thus, a detailed description of the structure of the first to the third test modules 210b, 220b and 230b will be omitted.

Figure 7:
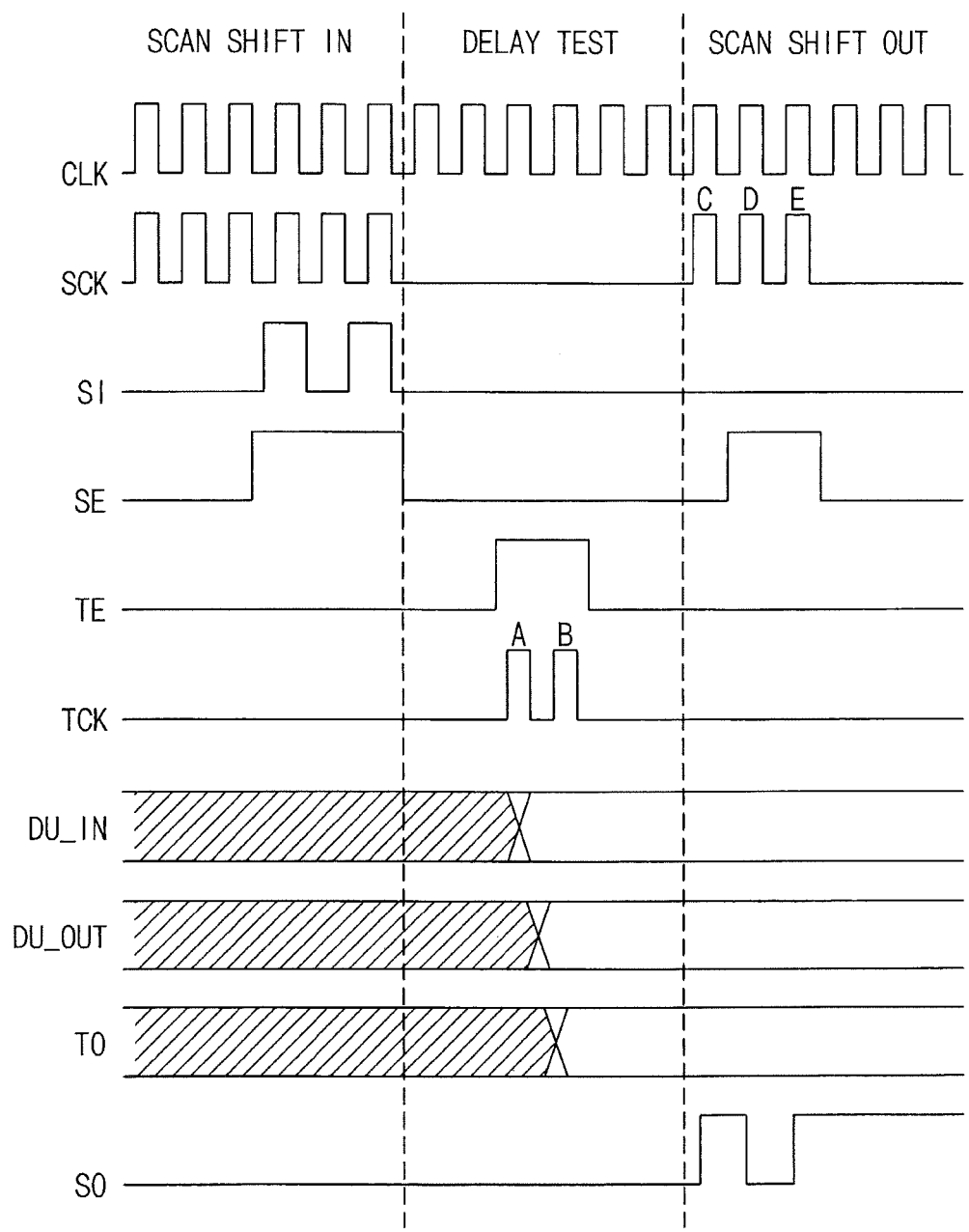
FIG. 7 is a timing diagram for describing an operation of the test device of FIG. 6.

FIG. 7 is a timing diagram for describing an operation of the test device of FIG. 6.

Hereinafter, an operation of the test device 1000b of FIG. 6 will be described with reference to FIGS. 3, 4, 6 and 7.

Referring to FIG. 7, an operation of the test device 1000b may be divided into a first operation stage SCAN SHIFT IN, a second operation stage DELAY STAGE and a third operation stage SCAN SHIFT OUT.

In the first operation stage SCAN SHIFT IN, the serial input signal SI including a sequence of bits is provided to the first flip-flop circuit 110b of the sequential logic circuit 100b while the serial enable signal SE is activated. In FIG. 7, the sequence of bits included in the serial input signal SI is '101'. Since the serial enable signal SE is activated, the first to the third flip-flop circuits 110b, 120b and 130b may latch a signal received from the second input terminal SII in synchronization with the serial clock signal SCK and output the latched signal through the output terminal QO, so that each bit of the serial input signal SI is shifted through the first to the third flip-flop circuits 110b, 120b and 130b.

At the end of the first operation stage SCAN SHIFT IN, all bits of the serial input signal SI may be latched by the sequential logic circuit 100b, the serial clock signal SCK may stop transitioning and the serial enable signal SE may be deactivated. At the end of the first operation stage SCAN SHIFT IN, the third flip-flop circuit 130b may output the first bit of the serial input signal SI (that is, '1' in FIG. 7) to the third test module 230b, the second flip-flop circuit 120b may output the second bit of the serial input signal SI (that is, '0' in FIG. 7) to the second test module 220b and the first flip-flop circuit 110b may output the third bit of the serial input signal SI (that is, '1' in FIG. 7) to the first test module 210b.

The test circuit 200b may be at standstill in the first operation stage SCAN SHIFT IN, since the test enable signal TE is deactivated such that the test clock signal TCK does not transition.

In the second operation stage DELAY STAGE, the first to the third flip-flop circuits 110b, 120b and 130b may continue to output the third to the first bits of the serial input signal SI, respectively, since the serial clock signal SCK does not transition in the second operation stage DELAY STAGE.

During the second operation stage DELAY STAGE, the test enable signal TE may be activated for two cycles of the system clock signal CLK. As described with reference to FIG. 4, the test clock signal TCK may be generated by performing an AND operation on the system clock signal CLK and the test enable signal TE. Therefore, as illustrated in FIG. 7, the test clock signal TCK having two consecutive pulses (that is, the first pulse A and the second pulse B) may be generated.

The first flip-flops 213 included in the first to the third test modules 210b, 220b and 230b may provide the third to the first bits of the test input signal TI to the first to the third delay units, respectively, as the delay input signal DU_IN in synchronization with the first pulse A of the test clock signal TCK. Each of the first to the third delay units may receive the delay input signal DU_IN and delay the delay input signal DU_IN to generate the delay output signal DU_OUT. The second flip-flops 217 included in the first to the third test modules 210b, 220b and 230b may provide the delay output signal DU_OUT to the second to the fourth flip-flop circuits 120b, 130b and 140b as the third to the first bits of the test output signal TO, respectively, in synchronization with the second pulse B of the test clock signal TCK.

At the end of the second operation stage DELAY STAGE, the first to the third test modules 210b, 220b and 230b may continue to output the third to the first bits of the test output signal TO, respectively, since the test clock signal TCK does not transition after the second pulse B.

In the third operation stage SCAN SHIFT OUT, the second to the fourth flip-flop circuits 120b, 130b and 140b may output the third to the first bits of the test output signals TO received from the second input terminal SII, respectively, in synchronization with the a pulse C of the serial clock signal SCK, since the scan enable signal SE is deactivated at the pulse C of the serial clock signal SCK. Therefore, the fourth flip-flop circuit 140b may output the first bit of the test output signal TO, which represents the result of the delay test on the third delay unit included in the third test module 230b, as a first bit of the serial output signal SO in synchronization with the pulse C of the serial clock signal SCK.

After the pulse C of the serial clock signal SCK, the serial enable signal SE is activated, and the latched bits of the test output signal TO may be shifted to right in synchronization with the pulses D and E of the serial clock signal SCK. Therefore, the fourth flip-flop circuit 140b may output the second bit of the test output signal TO, which represents the result of the delay test on the second delay unit included in the second test module 220b, as a second bit of the serial output signal SO in synchronization with the pulse D of the serial clock signal SCK, and output the third bit of the test output signal TO, which represents the result of the delay test on the first delay unit included in the first test module 210b, as a third bit of the serial output signal SO in synchronization with the pulse E of the serial clock signal SCK.

When a frequency of the system clock signal CLK is relatively low, a time between the first pulse A and the second pulse B of the test clock signal TCK may be relatively long, so that the delay input signals DU_IN, which are inputted to the first to the third delay units in synchronization with the first pulse A of the test clock signal TCK, may completely propagate through the first to the third delay units before the second pulse B of the test clock signal TCK.

When a frequency of the system clock signal CLK is relatively high, a time between the first pulse A and the second pulse B of the test clock signal TCK may be relatively short, so that the delay input signals DU_IN, which are inputted to the first to the third delay units in synchronization with the first pulse A of the test clock signal TCK, may not completely propagate through the first to the third delay units before the second pulse B of the test clock signal TCK.

If the delay test on all of the third to the first delay units is successful, each bit of the serial output signal SO may have the same value as a corresponding bit of the serial input signal SI. In FIG. 7, the serial output signal SO outputted from the fourth flip-flop circuits 140b is '101', which represents that all the delay tests on the first to the third delay units are successful.

If the delay test on the third delay unit is failed, the first bit of the serial output signal SO may not be equal to the first bit of the serial input signal SI. If the delay test on the second delay unit is failed, the second bit of the serial output signal SO may not be equal to the second bit of the serial input signal SI. If the delay test on the first delay unit is failed, the third bit of the serial output signal SO may not be equal to the third bit of the serial input signal SI.

Figure 8:
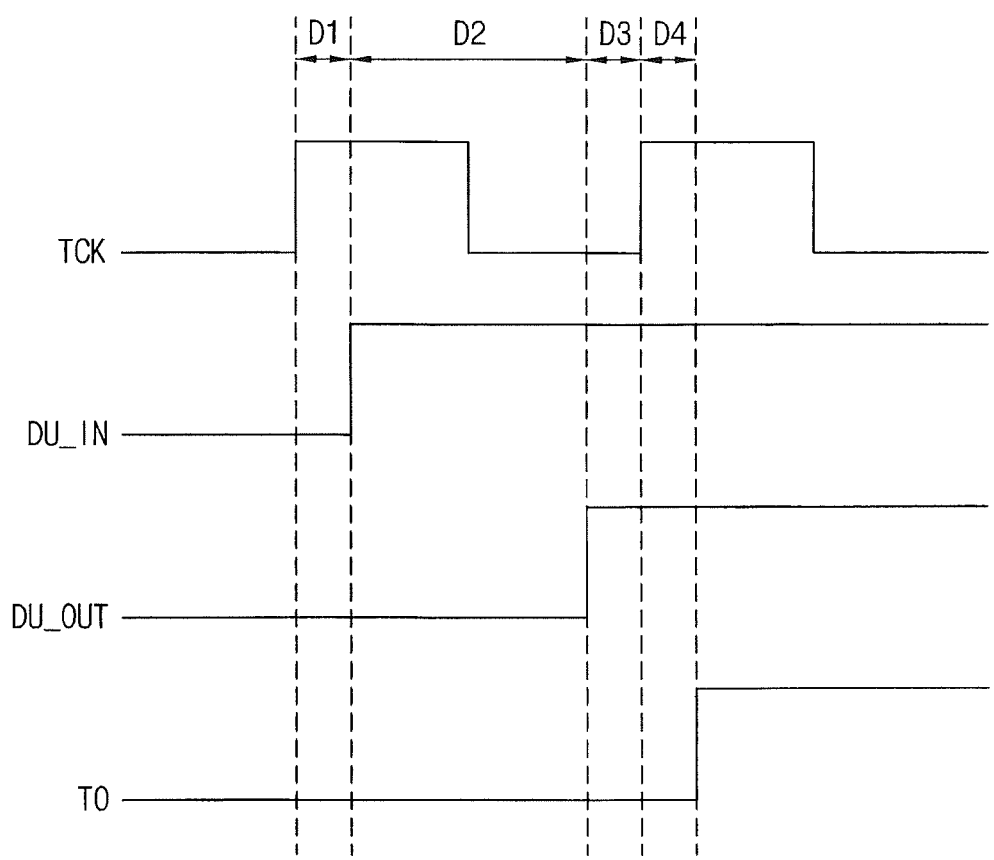
FIG. 8 is an enlarged timing diagram representing a second operation stage of a timing diagram of FIG. 7.

FIG. 8 is an enlarged timing diagram representing a second operation stage of a timing diagram of FIG. 7.

FIG. 8 represents a timing diagram of the second operation stage DELAY TEST when a maximum frequency of the system clock signal CLK in a condition that the serial output signal SO has the same value as the serial input signal SI is used.

A first delay D1 between a rising edge of the first pulse A of the test clock signal TCK and a transition of the delay input signal DU_IN may represent a clock-to-Q delay of the first flip-flop 213 illustrated in FIG. 4. A second delay D2 between the transition of the delay input signal DU_IN and a transition of the delay output signal DU_OUT may represent a delay of the delay unit 215 illustrated in FIG. 4. A third delay D3 between the transition of the delay output signal DU_OUT and a rising edge of the second pulse B of the test clock signal TCK may represent a setup time of the second flip-flop 217 illustrated in FIG. 4. That is, the delay output signal DU_OUT should be transited before the setup time of the second flip-flop 217 from the rising edge of the second pulse B of the test clock signal TCK so that the second flip-flop 217 may latch the transited delay output signal DU_OUT. A fourth delay D4 between the rising edge of the second pulse B of the test clock signal TCK and a transition of the test output signal TO may represent a clock-to-Q delay of the second flip-flop 217 illustrated in FIG. 4. If the second flip-flop 217 is manufactured to be identical to the first flip-flop 213, the fourth delay D4 may be the same as the first delay D1.

As illustrated in FIG. 8, when a maximum frequency of the system clock signal CLK in a condition that the serial output signal SO has the same value as the serial input signal SI is used, one period of the system clock signal CLK may be a sum of the first delay D1, the second delay D2 and the third delay D3. Therefore, the sum of the first delay D1, the second delay D2 and the third delay D3 may be determined by detecting the maximum frequency of the system clock signal CLK in a condition that the serial output signal SO has the same value as the serial input signal SI.

Figure 9:
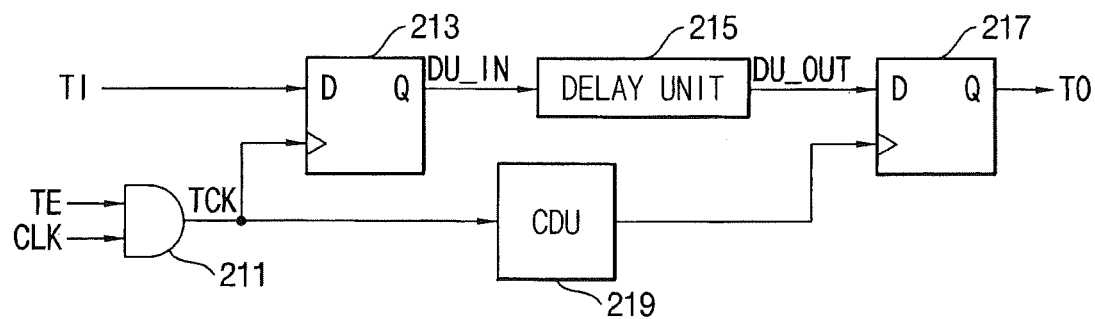
FIG. 9 is a circuit diagram illustrating a non-limiting example of a test module included in a test circuit of FIG. 6.

FIG. 9 is a circuit diagram illustrating an example of a test module included in a test circuit of FIG. 6.

A test module 210c of FIG. 9 has a same structure as the test module 210a of FIG. 4 except that the test module 210c includes a clock delay unit (CDU) 219 connected between the AND gate 211 and the second flip-flop 217. Therefore, a detail description of the AND gate 211, the first flip-flop 213, the delay unit 215 and the second flip-flop 217 will be omitted since the AND gate 211, the first flip-flop 213, the delay unit 215 and the second flip-flop 217 are described above with reference to FIG. 4.

The clock delay unit 219 may receive the test clock signal TCK and delay the test clock signal TCK by the fourth delay D4 (that is, a clock-to-Q delay of the second flip-flop 217).

If the second flip-flop 217 is manufactured to be identical to the first flip-flop 213, the fourth delay D4 may be the same as the first delay D1.

Therefore, when a maximum frequency of the system clock signal CLK in a condition that the serial output signal SO has the same value as the serial input signal SI is used, one period of the system clock signal CLK may be a sum of the second delay D2 and the third delay D3, not the sum of the first delay D1, the second delay D2 and the third delay D3.

A propagation time of the delay unit 215 is only the second delay D2. Therefore, if the test module 210c is used, the propagation time of the delay unit 215 may be determined more accurately.

Figure 10:
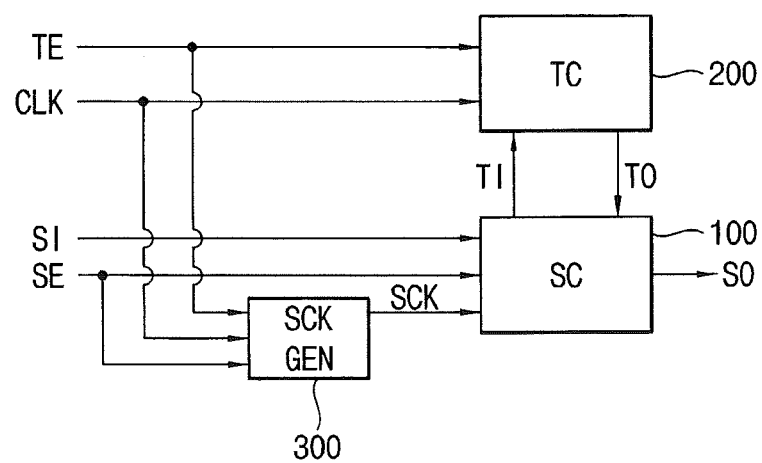
FIG. 10 is a diagram illustrating a test device for a system-on-chip according to example embodiments.

FIG. 10 is a diagram illustrating a test device for a system-on-chip according to example embodiments.

Referring to FIG. 10, a test device 2000 includes a sequential logic circuit 100, a test circuit 200 and a serial clock generating unit (SCK GEN) 300.

The test device 2000 of FIG. 10 has a same structure as the test device 1000 of FIG. 1 except that the test device 2000 includes the serial clock generating unit 300. Therefore, a detail description of the sequential logic circuit 100 and the test circuit 200 will be omitted since the sequential logic circuit 100 and the test circuit 200 are described above with reference to FIGS. 1 to 9.

The test device 1000 of FIG. 1 may receive the serial clock signal SCK from outside. On the contrary, the test device 2000 of FIG. 10 may generate the serial clock signal SCK by oneself.

The serial clock generating unit 300 may receive the system clock signal CLK, the test enable signal TE and the serial enable signal SE, and mask the system clock signal CLK using the test enable signal TE and the serial enable signal SE to generate the serial clock signal SCK. The serial clock generating unit 300 may provide the generated serial clock signal SCK to the sequential logic circuit 100.

Figure 11:
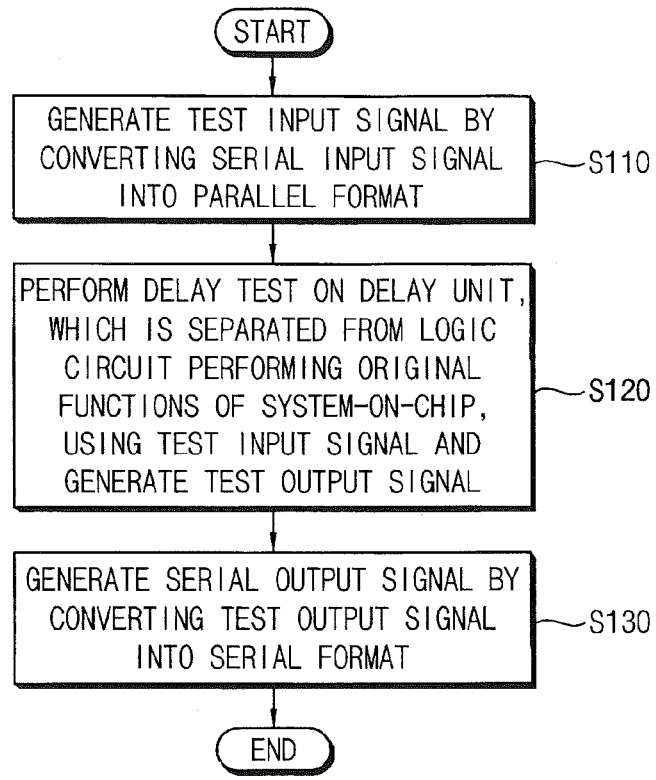
FIG. 11 is a flow chart illustrating a method of testing a system-on-chip according to example embodiments.

FIG. 11 is a flow chart illustrating a method of testing a system-on-chip according to example embodiments.

Hereinafter, a method of testing a system-on-chip will be described with reference to FIGS. 1 to 11.

Referring to FIG. 11, the sequential logic circuit 100 may generate the test input signal TI by converting the serial input signal SI into a parallel format in response to the serial clock signal SCK and the serial enable signal SE (step S110).

The test circuit 200 may perform a delay test on the delay unit 215, which is separated from a logic circuit performing original functions of the system-on-chip, using the test input signal TI received from the sequential logic circuit 100 in response to the system clock signal CLK and the test enable signal TE and provide the test output signal TO, which represents a result of the delay test, to the sequential logic circuit 100 (step S120).

The sequential logic circuit 100 may generate the serial output signal SO by converting the test output signal TO into a serial format in response to the serial clock signal SCK and the serial enable signal SE (step S130).

Figure 12:
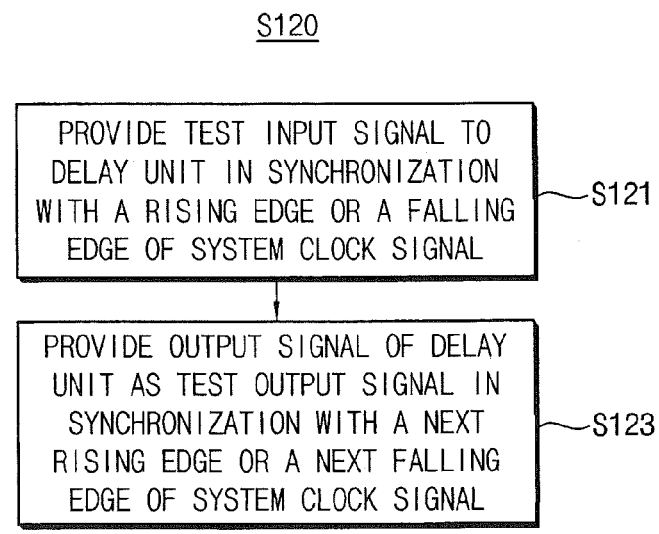
FIG. 12 is a flow chart illustrating a non-limiting example of performing delay test on delay unit in FIG. 11.

FIG. 12 is a flow chart illustrating an example of performing delay test on delay unit in FIG. 11.

Referring to FIG. 12, in the step S120, the test circuit 200 may provide the test input signal TI to the delay unit 215 in synchronization with a rising edge or a falling edge of the system clock signal CLK when the test enable signal TE is activated (step S121), and the test circuit 200 may provide an output signal of the delay unit 215 to the sequential logic circuit 100 as the test output signal TO in synchronization with a next rising edge or a next falling edge of the system clock signal CLK (step S123).

Figure 13:
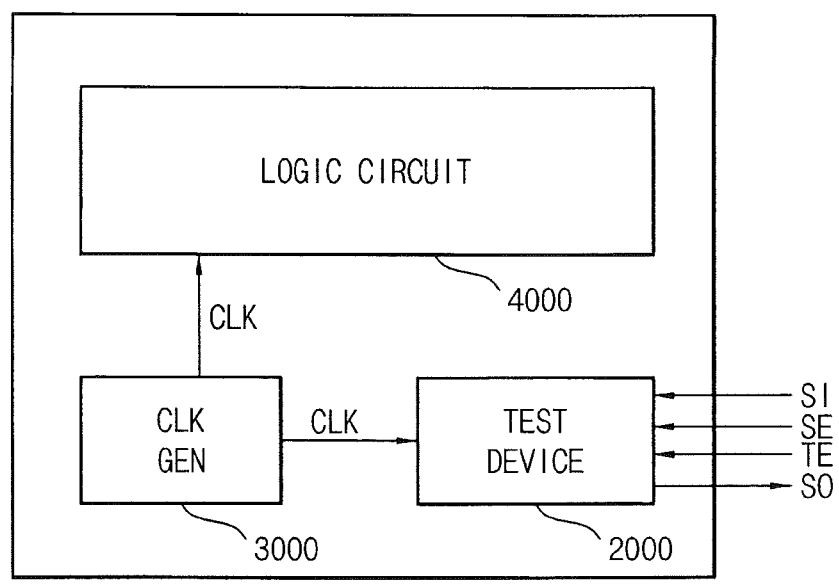
FIG. 13 is a block diagram illustrating a system-on-chip according to example embodiments.

FIG. 13 is a block diagram illustrating a system-on-chip according to example embodiments.

Referring to FIG. 13, a system-on-chip 5000 includes a test device 2000, a system clock generating unit (CLK GEN) 3000 and a logic circuit 4000.

The system clock generating unit 3000 generates a system clock signal CLK.

The logic circuit 4000 receives the system clock signal CLK from the system clock generating unit 3000 and performs original functions of the system-on-chip 5000.

The test device 2000 includes at least one delay unit that is separated from the logic circuit 4000. The test device 2000 receives the system clock signal CLK from the system clock generating unit 3000 and a serial input signal SI, a serial enable signal SE and a test enable signal TE from outside. The test device 2000 performs a delay test on the at least one delay unit using the serial input signal SI based on the system clock signal CLK, the serial enable signal SE and the test enable signal TE. The test device 2000 outputs a serial output signal SO representing a result of the delay test.

The test device 2000 may include a serial clock generating unit, a sequential logic circuit and a test circuit.

The serial clock generating unit may generate a serial clock signal SCK by masking the system clock signal CLK.

The sequential logic circuit may generate a test input signal TI by converting the serial input signal SI into a parallel format in response to the serial clock signal SCK and the serial enable signal SE and to generate the serial output signal SO by converting a test output signal TO into a serial format in response to the serial clock signal SCK and the serial enable signal SE.

The test circuit may include the at least one delay unit. The test circuit may perform the delay test on the at least one delay unit using the test input signal TI in response to the system clock signal SCK and the test enable signal TE and provide the test output signal TO that represents the result of the delay test to the sequential logic circuit.

The test circuit may include a same number of delay units as a number of bits included in the serial input signal SI, and perform the delay test on each of the at least one delay unit using each bit of the test input signal TI, respectively. Each bit of the test output signal TO may represent the result of the delay test on each of the at least one delay unit.

The test device 2000 of FIG. 13 may have a same structure as the test device 2000 of FIG. 10, and thus, a detail description of the test device 2000 of FIG. 13 will be omitted since the test device 2000 of FIG. 10 is described above with reference to FIGS. 1 to 10.

As described above, since the test device according to example embodiments includes at least one delay unit that is separated from a logic circuit performing original functions of the system-on-chip and performs a delay test on the at least one delay unit, the test device may accurately detect a path causing a delay and measure a propagation time of a path.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test device for a system-on-chip comprising:
    a sequential logic circuit configured to generate a test input signal by converting a serial input signal into a parallel format in response to a serial clock signal and a serial enable signal, the sequential logic circuit configured to generate a serial output signal by converting a test output signal into a serial format in response to the serial clock signal and the serial enable signal; and
    a test circuit including at least one delay unit, the delay unit being separated from a logic circuit, the logic circuit being configured to perform original functions of the system-on-chip, the test circuit configured to perform a delay test on the at least one delay unit using the test input signal in response to a system clock signal and a test enable signal, the test circuit configured to provide the test output signal to the sequential logic circuit, the test output signal representing a result of the delay test.

2. The test device of claim 1, wherein
the sequential logic circuit is configured to latch bits of the serial input signal to generate the test input signal and provide the test input signal to the test circuit in a first operation stage,
the test circuit is configured to perform the delay test on each of the at least one delay unit using each bit of the test input signal, respectively, and provide the test output signal to the sequential logic circuit in a second operation stage, each bit of the test output signal representing the result of the delay test on each of the at least one delay unit, and
the sequential logic circuit is configured to latch each bit of the test output signal to generate the serial output signal in a third operation stage.

3. The test device of claim 2, wherein the sequential logic circuit is configured to be in a first standby mode in the second operation stage, and the test circuit is configured to be in a second standby mode in the first operation stage and the third operation stage.

4. The test device of claim 1, wherein the at least one delay unit includes a replica of a path included in the logic circuit.

5. The test device of claim 1, wherein the at least one delay unit includes a plurality of inverters, each of the plurality of inverters including one of complementary metal oxide semiconductor (CMOS) transistors, p-channel metal oxide semiconductor (PMOS) transistors and n-channel metal oxide semiconductor (NMOS) transistors.

6. The test device of claim 1, wherein the test circuit includes a same number of delay units as a number of bits included in the serial input signal.

7. The test device of claim 6, wherein the test circuit is configured to perform the delay test on each of the at least one delay unit using each bit of the test input signal, respectively, and each bit of the test output signal represents the result of the delay test on each of the at least one delay unit.

8. The test device of claim 7, wherein
the serial input signal includes one bit, and
the sequential logic circuit is configured to latch the serial input signal in synchronization with the serial clock signal to generate the test input signal if the serial enable signal is activated, and latch the test output signal in synchronization with the serial clock signal to generate the serial output signal if the serial enable signal is deactivated.

9. The test device of claim 8, wherein
the sequential logic circuit includes a first flip-flop circuit and a second flip-flop circuit, each of the first flip-flop circuit and the second flip-flop circuit including a first input terminal, a second input terminal and an output terminal,
the first input terminal of the first flip-flop circuit is open, the second input terminal of the first flip-flop circuit is configured to receive the serial input signal and the output terminal of the first flip-flop circuit is configured to output the test input signal, and
the first input terminal of the second flip-flop circuit is configured to receive the test output signal, the second input terminal of the second flip-flop circuit is connected to the output terminal of the first flip-flop circuit and the output terminal of the second flip-flop circuit is configured to output the serial output signal.

10. The test device of claim 9, wherein each of the first flip-flop circuit and the second flip-flop circuit is configured to output a signal received at the second input terminal in synchronization with the serial clock signal if the serial enable signal is activated, and output a signal received at the first input terminal in synchronization with the serial clock signal if the serial enable signal is deactivated.

11. The test device of claim 10, wherein each of the first flip-flop circuit and the second flip-flop circuit includes:
a multiplexer configured to output the signal received at the second input terminal if the serial enable signal is activated and to output the signal received at the first input terminal if the serial enable signal is deactivated; and
a flip-flop configured to latch the output signal of the multiplexer in synchronization with the serial clock signal to output a latched signal.

12. The test device of claim 8, wherein the test circuit includes one delay unit, and the test circuit is configured to provide the test input signal to the one delay unit in synchronization with one of a rising edge and a falling edge of the system clock signal if the test enable signal is activated, and provide an output signal of the one delay unit to the sequential logic circuit as the test output signal in synchronization with one of a next rising edge and a next falling edge of the system clock signal.

13. The test device of claim 12, wherein the test circuit further includes:
an AND gate configured to perform an AND operation on the test enable signal and the system clock signal to output a test clock signal having a first pulse and a second pulse;
a first flip-flop configured to provide the test input signal to the one delay unit as a delay input signal in synchronization with the first pulse of the test clock signal; and
a second flip-flop configured to provide an output signal of the one delay unit to the sequential logic circuit as the test output signal in synchronization with the second pulse of the test clock signal, and
wherein the one delay unit is configured to receive the delay input signal and delay the delay input signal.

14. The test device of claim 13, wherein the test circuit further includes a clock delay unit connected between the AND gate and the second flip-flop, the clock delay unit configured to delay the test clock signal by a clock-to-Q delay of the second flip-flop.

15. The test device of claim 7, wherein
the serial input signal includes N bits, and
the sequential logic circuit is configured to latch the N bits of the serial input signal sequentially in synchronization with the serial clock signal to generate the test input signal having N bits if the serial enable signal is activated, latch N bits of the test output signal simultaneously in synchronization with the serial clock signal if the serial enable signal is deactivated, and output the latched N bits of the test output signal sequentially as the serial output signal, where N is a positive integer.

16. The test device of claim 15, wherein the test circuit includes N delay units, and the test circuit is configured to provide the N bits of the test input signal to the N delay units, respectively, in synchronization with one of a rising edge and a falling edge of the system clock signal if the test enable signal is activated, and provide output signals of the N delay units to the sequential logic circuit as the test output signal having N bits in synchronization with one of a next rising edge and a next falling edge of the system clock signal.

17. The test device of claim 1, further comprising:
a serial clock generating unit configured to generate the serial clock signal by masking the system clock signal.

18. A system-on-chip comprising:
a clock generator configured to generate a system clock signal;
a logic circuit configured to perform original functions of the system-on-chip; and
a test device including at least one delay unit, the at least one delay unit separated from the logic circuit, the test device configured to perform a delay test on the at least one delay unit using a serial input signal in response to the system clock signal, a serial enable signal and a test enable signal, the test device being configured to provide a serial output signal representing a result of the delay test.

19. The system-on-chip of claim 18, wherein the test device includes
a serial clock generating unit configured to generate a serial clock signal by masking the system clock signal;
a sequential logic circuit configured to generate a test input signal by converting the serial input signal into a parallel format in response to the serial clock signal and the serial enable signal, the sequential logic circuit being further configured to generate the serial output signal by converting a test output signal into a serial format in response to the serial clock signal and the serial enable signal; and
a test circuit including the at least one delay unit, the test circuit configured to perform the delay test on the at least one delay unit using the test input signal in response to the system clock signal and the test enable signal, the test circuit being further configured to provide the test output signal that represents the result of the delay test to the sequential logic circuit.

20. The system-on-chip of claim 19, wherein
the test circuit includes a same number of delay units as a number of bits included in the serial input signal, and
the test circuit is configured to perform the delay test on each of the at least one delay unit using each bit of the test input signal, respectively, and each bit of the test output signal represents the result of the delay test on each of the at least one delay unit.

* * * * *